(12) United States Patent
Nelogal et al.

(10) Patent No.: US 11,514,951 B2
(45) Date of Patent: Nov. 29, 2022

(54) IDENTIFICATION OF STORAGE RESOURCES IN MULTIPLE DOMAINS

(71) Applicant: Dell Products L.P., Round Rock, TX (US)

(72) Inventors: Chandrashekar Nelogal, Round Rock, TX (US); Heerak Sudhir Kumar Surti, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/489,187

(22) Filed: Sep. 29, 2021

(65) Prior Publication Data

US 2022/0020398 A1 Jan. 20, 2022

Related U.S. Application Data

(62) Division of application No. 16/549,937, filed on Aug. 23, 2019, now Pat. No. 11,164,607.

(51) Int. Cl.
*G06F 3/06* (2006.01)
*G11B 33/12* (2006.01)
*H05K 7/14* (2006.01)
*G06F 12/00* (2006.01)
*G06F 3/00* (2006.01)

(52) U.S. Cl.
CPC .............. *G11B 33/128* (2013.01); *G06F 3/06* (2013.01); *G06F 3/0604* (2013.01); *G06F 3/067* (2013.01); *G06F 3/0638* (2013.01); *G06F 12/00* (2013.01); *H05K 7/1492* (2013.01); *G06F 3/00* (2013.01)

(58) Field of Classification Search
None
See application file for complete search history.

(56) References Cited

U.S. PATENT DOCUMENTS

| | | | |
|---|---|---|---|
| 2007/0094472 A1* | 4/2007 | Marks | G06F 3/0662 |
| | | | 711/170 |
| 2008/0281992 A1* | 11/2008 | Hsu | G06F 13/37 |
| | | | 710/4 |

* cited by examiner

*Primary Examiner* — Scott C Sun
(74) *Attorney, Agent, or Firm* — Jackson Walker L.L.P.

(57) ABSTRACT

An information handling system may include a processor and a storage subsystem. The storage subsystem may include a non-expander backplane, a first plurality of storage resources coupled to the processor via the non-expander backplane, and a second plurality of storage resources coupled to the processor via a communication path that does not include the non-expander backplane. The information handling system may be configured to provide slot numbers for the storage resources according to a numbering scheme in which a storage resource from the first plurality of storage resources and a storage resource from the second plurality of storage resources have the same slot number.

20 Claims, 8 Drawing Sheets

| BYTE | BIT | | | | | | | |
|---|---|---|---|---|---|---|---|---|
| | 7 | 6 | 5 | 4 | 3 | 2 | 1 | 0 |
| 0 | NUMBER OF PHY DESCRIPTORS | | | | | | | |
| 1 | DESCRIPTOR TYPE (00b) | RESERVED | | | | | | NOT ALL PHYS |
| 2 | RESERVED | | | | | | | |
| 3 | DEVICE SLOT NUMBER | | | | | | | |
| | PHY DESCRIPTOR LIST | | | | | | | |
| 4 ooo 31 | PHY DESCRIPTOR (FIRST) (SEE TABLE 44) | | | | | | | |
| ooo | ooo | | | | | | | |
| Z - 27 ooo Z | PHY DESCRIPTOR (LAST) (SEE TABLE 44) | | | | | | | |

| BYTE | BIT | | | | | | | |
|---|---|---|---|---|---|---|---|---|
| | 7 | 6 | 5 | 4 | 3 | 2 | 1 | 0 |
| 0 | NUMBER OF PHY DESCRIPTORS | | | | | | | |
| 1 | DESCRIPTOR TYPE (00b) | | RESERVED | | | | | NOT ALL PHYS |
| | PHY DESCRIPTOR LIST | | | | | | | |
| 2 ... 29 | PHY DESCRIPTOR (FIRST) (SEE TABLE 44) | | | | | | | |
| ... | ... | | | | | | | |
| Z-27 ... Z | PHY DESCRIPTOR (LAST) (SEE TABLE 44) | | | | | | | |

FIG. 4B

| BYTE | BIT | | | | | | | |
|---|---|---|---|---|---|---|---|---|
| | 7 | 6 | 5 | 4 | 3 | 2 | 1 | 0 |
| 0 | NUMBER OF PHY DESCRIPTORS | | | | | | | |
| 1 | DESCRIPTOR TYPE (00b) | | RESERVED | | | DEVICE SLOT DOMAIN | | NOT ALL PHYS |
| 2 | RESERVED | | | | | | | |
| 3 | DEVICE SLOT NUMBER | | | | | | | |
| PHY DESCRIPTOR LIST | | | | | | | | |
| 4 ooo 31 | PHY DESCRIPTOR (FIRST) (SEE TABLE 44) | | | | | | | |
| ooo | ooo | | | | | | | |
| Z-27 ooo Z | PHY DESCRIPTOR (LAST) (SEE TABLE 44) | | | | | | | |

FIG. 4C

| BYTE | BIT | | | | | | | |
|---|---|---|---|---|---|---|---|---|
| | 7 | 6 | 5 | 4 | 3 | 2 | 1 | 0 |
| 0 | NUMBER OF PHY DESCRIPTORS | | | | | | | |
| 1 | DESCRIPTOR TYPE (00b) | RESERVED | | | DEVICE SLOT DOMAIN | | NOT ALL PHYS | |
| | PHY DESCRIPTOR LIST | | | | | | | |
| 2 | PHY DESCRIPTOR (FIRST) (SEE TABLE 44) | | | | | | | |
| ooo | | | | | | | | |
| 29 | | | | | | | | |
| ooo | ooo | | | | | | | |
| Z-27 | PHY DESCRIPTOR (LAST) (SEE TABLE 44) | | | | | | | |
| ooo | | | | | | | | |
| Z | | | | | | | | |

FIG. 4D

| BYTE | BIT | | | | | | | |
|---|---|---|---|---|---|---|---|---|
| | 7 | 6 | 5 | 4 | 3 | 2 | 1 | 0 |
| 0 | COMMON STATUS | | | | | | | |
| 1 | SLOT ADDRESS | | | | | | | |
| 2 | APP CLIENT BYPASSED A | DO NOT REMOVE | ENCLOSURE BYPASSED A | ENCLOSURE BYPASSED B | READY TO INSERT | RMV | IDENT | REPORT |
| 3 | APP CLIENT BYPASSED B | FAULT SENSED | FAULT REQUESTED | DEVICE OFF | BYPASSED A | BYPASSED B | DEVICE BYPASSED A | DEVICE BYPASSED B |

FIG. 5A

| KIND OF STATUS ELEMENT | CONDITION | DESCRIPTION |
|---|---|---|
| OVERALL | ANY | VENDOR SPECIFIC |
| INDIVIDUAL | DEVICE SLOT IS FOR A PARALLEL SCSI DEVICE | SCSI ADDRESS OF THE PRIMARY PARALLEL SCSI TARGET PORT OF THE SCSI TARGET DEVICE |
| | DEVICE SLOT IS NOT FOR A PARALLEL SCSI DEVICE | VENDOR SPECIFIC |

| BYTE | BIT | | | | | | | |
|---|---|---|---|---|---|---|---|---|
| | 7 | 6 | 5 | 4 | 3 | 2 | 1 | 0 |
| 0 | COMMON STATUS | | | | | | | |
| 1 | SLOT ADDRESS | | | | | | DEVICE SLOT DOMAIN | |
| 2 | APP CLIENT BYPASSED A | DO NOT REMOVE | ENCLOSURE BYPASSED A | ENCLOSURE BYPASSED B | READY TO INSERT | RMV | IDENT | REPORT |
| 3 | APP CLIENT BYPASSED B | FAULT SENSED | FAULT REQUESTED | DEVICE OFF | BYPASSED A | BYPASSED B | DEVICE BYPASSED A | DEVICE BYPASSED B |

FIG. 5D

| KIND OF STATUS ELEMENT | CONDITION | DESCRIPTION |
|---|---|---|
| OVERALL | ANY | VENDOR SPECIFIC |
| INDIVIDUAL | DEVICE SLOT IS FOR A PARALLEL SCSI DEVICE | SCSI ADDRESS OF THE PRIMARY PARALLEL SCSI TARGET PORT OF THE SCSI TARGET DEVICE |
| | DEVICE SLOT IS NOT FOR A PARALLEL SCSI DEVICE | VENDOR SPECIFIC |

IDENTIFICATION OF STORAGE RESOURCES IN MULTIPLE DOMAINS

CROSS-REFERENCE TO RELATED APPLICATIONS

The present application is a divisional of U.S. patent application Ser. No. 16/549,937, filed Aug. 23, 2019. All of these applications are hereby incorporated by reference herein in their entireties.

TECHNICAL FIELD

The present disclosure relates in general to information handling systems, and more particularly to systems and methods for identifying storage resources in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Various techniques may be used to couple storage resources to an information handling system (e.g., to a processor of an information handling system). For example, Small Computer System Interface (SCSI) Enclosure Services (SES) is a common protocol for establishing a connection to an external enclosure housing storage resources. In some embodiments, such an enclosure may include a storage enclosure processor (SEP) for facilitating communication among the storage resources and with other information handling systems. Further, the Serial-Attached SCSI (SAS) architecture is sometimes used within a SES enclosure, providing a serial device interconnect and a transport protocol. SAS physical links (referred to as phys) are typically a set of wires configured as two differential signal pairs (e.g., one for transmission of signals in each direction).

Some enclosures use multiple backplanes to couple to storage resources that are located in different regions of a chassis (e.g., front, mid, rear, etc.). For example, an expander backplane may enable connections between a single controller port and multiple storage resources by routing phys between the expander backplane's ports with a SEP. For example, an expander backplane might have an ×2 SAS link (comprising two phys) connected on the upstream side, but four phys on the downstream side connected to storage resources. A SEP may be used to multiplex/demultiplex the communications between the upstream and downstream paths.

A non-expander backplane, in contrast, may have the same number of phys on the upstream side and the downstream side.

In enclosures with multiple backplanes, an issue sometimes arises in the context of drive identification numbers (e.g., slot numbers used to refer to specific storage resources). For example, consider an enclosure in which a storage controller is coupled to an expander backplane, which in turn is connected to a downstream non-expander backplane. The drives connected to the downstream non-expander backplane are currently numbered in continuation with the numbering of those connected to the upstream expander backplane. For example, if the upstream expander backplane allows for 24 drives to be connected, those drives may be numbered as 0 through 23, and the drives connected to the downstream non-expander backplane may be numbered beginning at 24.

Another example may be a chassis with drives in a mid bay coupled to a mid backplane, where the numbering of the drives in the mid bay continues in sequence after the front and rear drive numberings.

This situation is non-optimal, as many users and administrators would prefer all of the drives coupled to a particular backplane (regardless of whether that backplane is an expander or non-expander type) to be numbered starting from 0. This may be because typically, all of the drives coupled to a particular backplane are located in the same region of the chassis. Thus it is more convenient for all of the drives in a given region to have numbers that relate to one another, and not to drives in other regions.

Up until now, it has not been possible to have multiple storage resources (e.g., storage resources that are coupled to different backplanes) addressed by the same slot number. Embodiments of this disclosure may provide techniques for doing so, as well as various other benefits.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with identifying storage resource in information handling systems may be reduced or eliminated.

In accordance with embodiments of the present disclosure, an information handling system may include a processor and a storage subsystem. The storage subsystem may include a non-expander backplane, a first plurality of storage resources coupled to the processor via the non-expander backplane, and a second plurality of storage resources coupled to the processor via a communication path that does not include the non-expander backplane. The information handling system may be configured to provide slot numbers for the storage resources according to a numbering scheme in which a storage resource from the first plurality of storage resources and a storage resource from the second plurality of storage resources have the same slot number.

In accordance with these and other embodiments of the present disclosure, a method may include providing slot numbers for storage resources in a SCSI enclosure services (SES) chassis that includes a processor, a non-expander backplane, a first plurality of storage resources coupled to the processor via the non-expander backplane, and a second plurality of storage resources coupled to the processor via a communication path that does not include the non-expander backplane; wherein the slot numbers are provided according to a numbering scheme in which a storage resource from the first plurality of storage resources and a storage resource from the second plurality of storage resources have the same slot number; and wherein the providing includes setting a portion of an SES diagnostic page that is designated as reserved to indicate that the storage resource from the first plurality of storage resources and the storage resource from the second plurality of storage resources are associated with different storage domains.

In accordance with these and other embodiments of the present disclosure, an article of manufacture may include a non-transitory, computer-readable medium having computer-executable code thereon that is executable by a processor of an information handling system for: providing slot numbers for storage resources in a chassis that includes a processor, a non-expander backplane, a first plurality of storage resources coupled to the processor via the non-expander backplane, and a second plurality of storage resources coupled to the processor via a communication path that does not include the non-expander backplane; wherein the slot numbers are provided according to a numbering scheme in which a storage resource from the first plurality of storage resources and a storage resource from the second plurality of storage resources have the same slot number; and wherein the providing includes setting a portion of a data structure that is designated as reserved to indicate that the storage resource from the first plurality of storage resources and the storage resource from the second plurality of storage resources are associated with different storage domains.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates a block diagram of another example storage resource enclosure, in accordance with embodiments of the present disclosure; and FIGS. 4A-4D and 5A-5D provide tables showing page layouts for diagnostic pages for enclosure service devices, in accordance with embodiments of the present disclosure.

DETAILED DESCRIPTION

Figure 1:
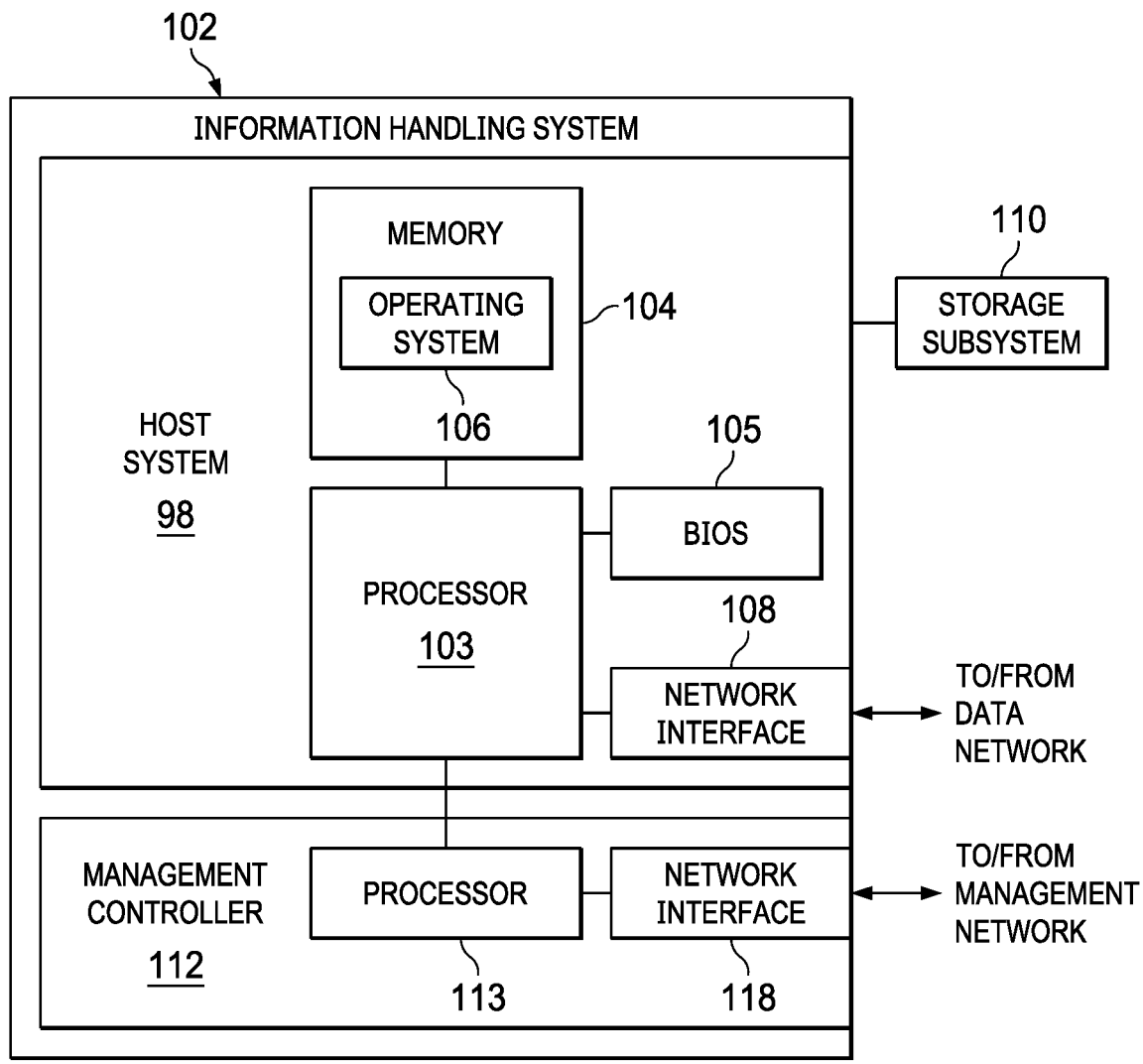
FIG. 1 illustrates a block diagram of an example information handling system, in accordance with embodiments of the present disclosure.

Preferred embodiments and their advantages are best understood by reference to FIGS. 1 through 5D, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

For the purposes of this disclosure, the term "management controller" may broadly refer to an information handling system that provides management functionality (typically out-of-band management functionality) to one or more other information handling systems. In some embodiments, a management controller may be (or may be an integral part of) a service processor, a baseboard management controller (BMC), a chassis management controller (CMC), or a remote access controller (e.g., a Dell Remote Access Controller (DRAC) or Integrated Dell Remote Access Controller (iDRAC)).

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources" or simply "storage resources"). As shown in FIG. 1, information handling system 102 may comprise a processor 103, a memory 104 communicatively coupled to processor 103, a BIOS 105 (e.g., a UEFI BIOS) communicatively coupled to processor 103, a network interface 108 communicatively coupled to processor 103, and a management controller 112 communicatively coupled to processor 103.

In operation, processor 103, memory 104, BIOS 105, and network interface 108 may comprise at least a portion of a host system 98 of information handling system 102. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

Management controller 112 may be configured to provide management functionality for the management of information handling system 102. Such management may be made by management controller 112 even if information handling system 102 and/or host system 98 are powered off or powered to a standby state. Management controller 112 may include a processor 113, memory, and a network interface 118 separate from and physically isolated from network interface 108.

As shown in FIG. 1, processor 113 of management controller 112 may be communicatively coupled to processor 103. Such coupling may be via a Universal Serial Bus (USB), System Management Bus (SMBus), and/or one or more other communications channels.

Network interface 118 may be coupled to a management network, which may be separate from and physically isolated from the data network as shown. Network interface 118 of management controller 112 may comprise any suitable system, apparatus, or device operable to serve as an interface between management controller 112 and one or more other information handling systems via an out-of-band management network. Network interface 118 may enable management controller 112 to communicate using any suitable transmission protocol and/or standard. In these and other embodiments, network interface 118 may comprise a network interface card, or "NIC." Network interface 118 may be the same type of device as network interface 108, or in other embodiments it may be a device of a different type.

Additionally, information handling system 102 may be coupled to storage subsystem 110. In some embodiments, storage subsystem 110 may be an external drive enclosure including one or more storage resources therein. In other embodiments, storage subsystem 110 may be an integral part of information handling system 102. For example, in some embodiments, information handling system 102 may itself be a drive enclosure.

Figure 2:
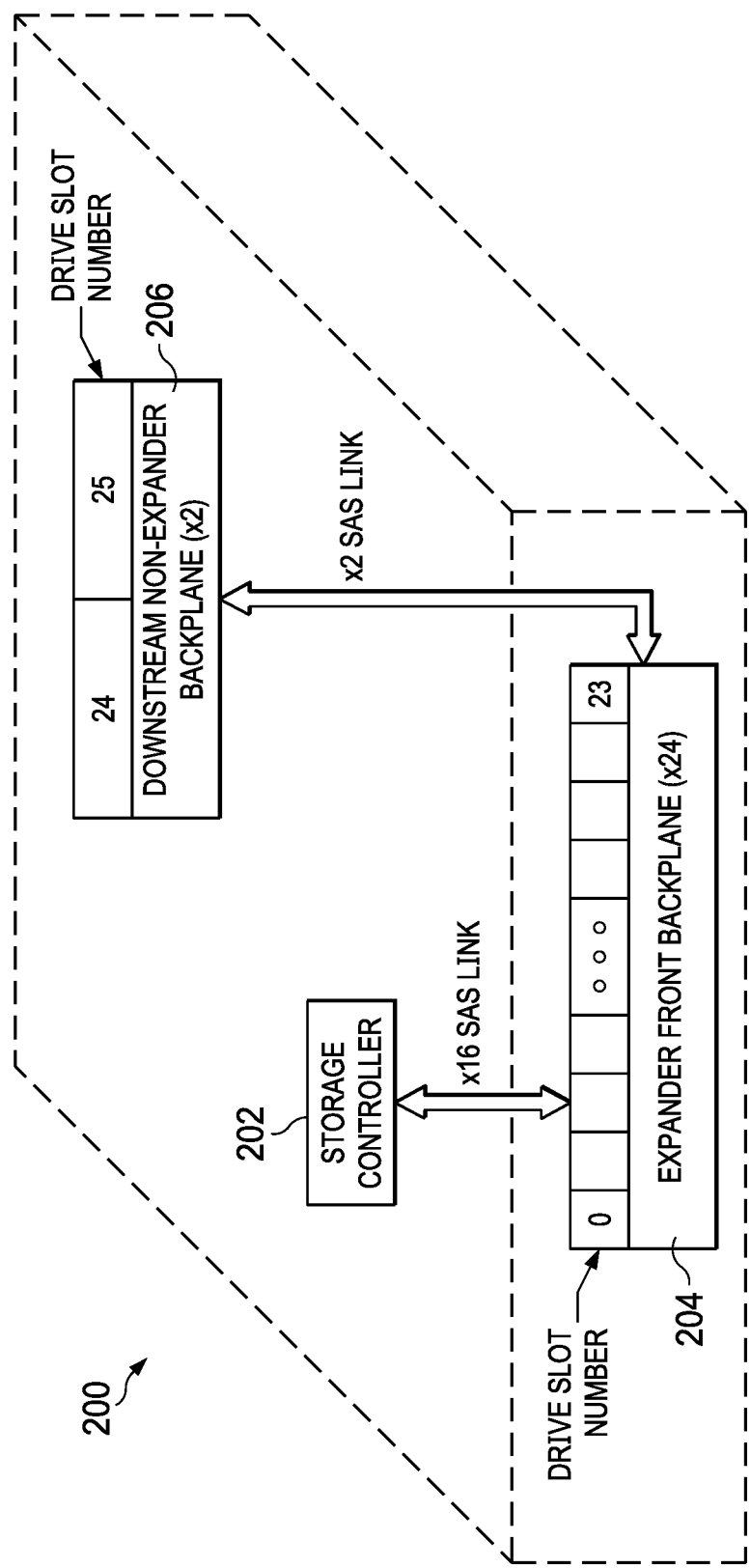
FIG. 2 illustrates a block diagram of an example storage resource enclosure, in accordance with embodiments of the present disclosure.

Turning now to FIG. 2, an example drive enclosure 200 is shown. Storage controller 202 (which may be internal or external to drive enclosure 200) may comprise any system, device, or apparatus configured to carry out storage operations (e.g., input/output) within drive enclosure 200. Storage controller 202 may include a storage enclosure processor (SEP) as a component thereof. Storage controller 202 may be coupled to one or more information handling systems (not shown).

Drive enclosure 200 may include two backplanes in this embodiment. Expander front backplane 204 may be coupled directly to storage controller 202 via an ×16 SAS link. Expander front backplane 204 may expand that ×16 link into 24 SAS links for coupling to storage resources that may be located in a front region of drive enclosure 200. Further, expander front backplane 204 may be coupled to downstream non-expander backboard 206 via an ×2 SAS link.

The numbering scheme shown in FIG. 2 for the 26 possible drives may be undesirable. In particular, numbering the drives in the front region of the chassis as 0 through 23, and the drives in the rear region of the chassis as 24 and 25 may be considered non-intuitive and inconvenient for a user of drive enclosure 200.

A more desirable scheme may include restarting the numbering for each region of the drive enclosure (e.g., front, rear, mid, etc.). In this example, the front bay would have drives 0 through 23, and the rear bay would have drives 0 and 1. Various reasons may support the desire to restart the numbering scheme from zero for each backplane.

Figures 3, 4A:
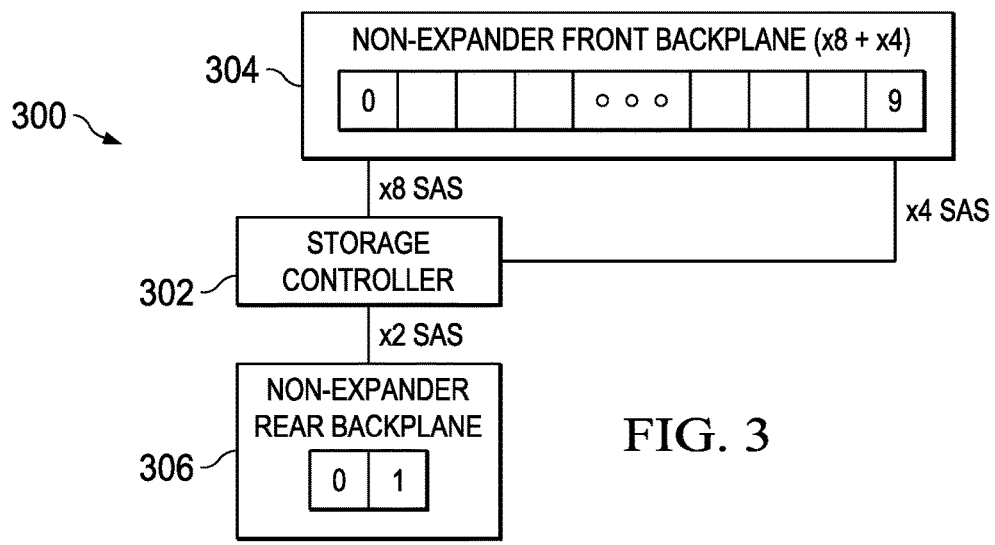

Turning now to FIG. 3, an embodiment is shown in which a more desirable numbering is used in drive enclosure 300.

As shown in FIG. 3, storage controller 302 may be coupled to a non-expander front backplane 304 via multiple connections: an ×8 SAS link as well as an ×4 SAS link. Storage controller 302 may further be coupled to non-expander rear backplane 306 via an ×2 SAS link.

In a non-expander topology such as the one shown in FIG. 3 (e.g., in which a SEP device is present on each of multiple backplanes), the numbering may restart from zero for each backplane (e.g., because the SEP devices on each backplane are independent of each other).

Numbering schemes based solely on phy numbers may not work as smoothly, as there may be unused phys. For example, in the embodiment of drive enclosure 300, phys 10 and 11 from storage controller 302 may not be connected to any drives (e.g., because half of the ×4 SAS link may be connected to drives in slots 8 and 9, the other half comprising phys 10 and 11 may remain unconnected). The rear drives are connected to phys 12 and 13. Accordingly, a numbering scheme based on phy numbers alone would have drives 0-9 in the front region and drives 12 and 13 in the rear region.

This may be undesirable, as many users desire rear drives to start from zero (particularly as they are typically used as OS drives).

In light of all of these considerations, it may be desirable for all backplanes (expander and non-expander) within a given enclosure to start their drive numberings from zero.

In current designs, a SEP device may be included in expander backplanes for backplane management. This SEP device may provide the SES functionality with which the devices connected to the expanders are managed. The SES implementation by the SEP device may represent all of the drives in an enclosure as if they are in a single backplane, which implies that they are in the undesirable continuous slot order numbering for drives in different regions of the enclosure.

This representation is consistent in SES pages 02h (enclosure status and control diagnostic page) and 0Ah (additional element status diagnostic page). As one of ordinary skill in the art with the benefit of this disclosure will readily understand, references to specific diagnostic page codes may be made with citation to the SCSI Enclosure Services standard promulgated by the International Committee for Information Technology Standards. For the sake of completeness, this standard is incorporated by reference herein.

SES page 02h represents a drive with an array device element. All elements may be represented by a single-dimensional array with linearly increasing index value. This representation method inhibits the ability to represent the same drive slot number on two different backplanes with nonlinear numbering.

SES page 0Ah represents a drive with an additional element status descriptor. Although the additional element status descriptor provides for the device slot number to be set by the SEP device independently for each element, it may not be sufficient to differentiate or identify the particular storage domain (e.g., front/mid/rear, the particular backplane to which the drive is connected, or the region of the chassis) for that drive.

With these limitations in mind, there is no straightforward way to represent drives located in different storage domains with the same device slot number. However, embodiments of this disclosure may use portions of one or more SES diagnostic pages (e.g., portions that are marked by the standard as reserved) in order to store information that allows a system to differentiate between drives that have the same slot number but are coupled to different storage domains.

FIGS. 4A and 4B provide tables showing the current layout of SES page 0Ah. In particular, FIG. 4A shows the additional element status descriptor protocol specific information for device slot elements and array device slot elements for SAS with the EIP bit set to one. FIG. 4B shows the corresponding page with the EIP bit set to zero.

FIGS. 4C and 4D provide tables that respectively correspond to the tables shown in FIGS. 4A and 4B. In FIGS. 4C and 4D, however, two bits of reserved storage space have been used to indicate the "device slot domain."

That is, in this embodiment, reserved bits in byte 1 of the additional element status descriptor specific information for device slot elements and array device slot elements field may be used to represent different backplanes in a system.

In this embodiment, bits 1 and 2 of byte 1 may represent the storage domain, which can be represented by values as 00b, 01b, 10b and 11b, each value representing a location of backplane. For example, 01b may represent the front backplane, 00b may represent the rear backplane, and 10b may represent the mid backplanes, etc. Slot numbering is being represented in this embodiment by byte 3, the device slot number.

According to another embodiment, a different SES diagnostic page may be used.

FIGS. 5A and 5B provide tables showing the current layout of SES page 02h. In particular, FIG. 5A shows the device slot status element. FIG. 5B shows the slot address field.

FIGS. 5C and 5D provide tables that respectively correspond to the tables shown in FIGS. 5A and 5B. In FIGS. 5C and 5D, however, two bits of reserved storage space have been used to indicate the "device slot domain." (FIG. 5D is identical to FIG. 5B and is included merely for completeness.)

In particular, in this embodiment, the device slot status element may be used to represent the storage domain of the backplane. Byte 1 may be used to represent the storage domain of the backplane in the embodiment shown, with bits 0 and 1 representing storage domains as 00b, 01b, 10b, 11b, each value representing a location of backplane. For example, as in FIG. 4, 01b may represent the front backplane, 00b may represent the rear backplane, 10b may represent the mid backplane, etc. In other embodiments, different numbering schemes may also of course be used.

Bits 3-7 are still used to represent the drive slot number within that storage domain, such that there are $2^6=64$ possible slot numbers (instead of the $2^8=256$ slot numbers currently available). Thus in the embodiment shown, only 64 drive slots are representable for each storage domain.

In practice, 64 slot numbers per storage domain may be sufficient. In other embodiments, however, a different number of reserved bits may be used. For example, with only one reserved bit used to represent the storage domain, a different tradeoff is obtained: 2 possible storage domains instead of 4, but 128 slots per storage domain instead of 64.

In yet other embodiments, different possibilities for storage of the domain information may be used. For example, reserved portions of other SES diagnostic pages may be used, different numbers of reserved bits may be used, etc.

Although various possible advantages with respect to embodiments of this disclosure have been described, one of ordinary skill in the art with the benefit of this disclosure will understand that in any particular embodiment, not all of such advantages may be applicable. In any particular embodiment, some, all, or even none of the listed advantages may apply.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
a processor; and
a storage subsystem including:
a non-expander backplane; and
storage resources including: a first plurality of storage resources coupled to the processor via the non-expander backplane; and a second plurality of storage resources coupled to the processor via a communication path that does not include the non-expander backplane;
wherein the information handling system is configured to provide slot numbers for the storage resources according to a numbering scheme in which a first storage resource from the first plurality of storage resources and a second storage resource from the second plurality of storage resources have the same slot number; and
wherein the providing includes setting a portion of a data structure that is designated as reserved to indicate that the first storage resource and the second storage resource are associated with different storage domains.

2. The information handling system of claim 1, wherein the second plurality of storage resources are coupled to the processor via an expander backplane, and wherein the non-expander backplane is coupled to the processor via the expander backplane.

3. The information handling system of claim 1, wherein the non-expander backplane does not include a storage enclosure processor.

4. The information handling system of claim 1, wherein the storage subsystem further includes an expander backplane, and a third plurality of storage resources coupled to the processor via the expander backplane.

5. The information handling system of claim 1, wherein the storage subsystem includes a SCSI enclosure services (SES) chassis.

6. The information handling system of claim 5, wherein the data structure is an SES diagnostic page.

7. The information handling system of claim 6, wherein the SES diagnostic page is selected from the group consisting of page 02h and page 0Ah.

8. A method comprising:
providing slot numbers for storage resources in a chassis that includes a processor, a non-expander backplane, and storage resources including a first plurality of storage resources coupled to the processor via the non-expander backplane, and a second plurality of storage resources coupled to the processor via a communication path that does not include the non-expander backplane;
wherein the slot numbers are provided according to a numbering scheme in which a storage resource from the first plurality of storage resources and a storage resource from the second plurality of storage resources have the same slot number; and
wherein the providing includes setting a portion of a data structure that is designated as reserved to indicate that the first storage resource and the second storage resource are associated with different storage domains.

9. The method of claim 8, wherein the data structure includes a SCSI enclosure services (SES) diagnostic page.

10. The method of claim 8, wherein the different storage domains each include a set of contiguous slot numbers.

11. The method of claim 10, wherein each set of contiguous slot numbers starts at slot number 0.

12. The method of claim 11, wherein at least one of the storage domains includes an unused SCSI phy that is not coupled to any storage resource.

13. An article of manufacture comprising a non-transitory, computer-readable medium having computer-executable code thereon that is executable by a processor of an information handling system for:
providing slot numbers for storage resources in a chassis that includes a processor, a non-expander backplane, a first plurality of storage resources coupled to the processor via the non-expander backplane, and a second plurality of storage resources coupled to the processor via a communication path that does not include the non-expander backplane;
wherein the slot numbers are provided according to a numbering scheme in which a first storage resource from the first plurality of storage resources and a second storage resource from the second plurality of storage resources have the same slot number; and
wherein the providing includes setting a portion of a data structure that is designated as reserved to indicate that the first storage resource and the second storage resource are associated with different storage domains.

14. The article of claim 13, wherein the second plurality of storage resources are coupled to the processor via an expander backplane.

15. The article of claim 14, wherein the non-expander backplane is coupled to the processor via the expander backplane.

16. The article of claim 13, wherein the non-expander backplane does not include a storage enclosure processor.

17. The article of claim 13, wherein the chassis further includes an expander backplane, and a third plurality of storage resources coupled to the processor via the expander backplane.

18. The article of claim 13, wherein the chassis is a SCSI enclosure services (SES) chassis.

19. The article of claim 18, wherein the data structure is an SES diagnostic page.

20. The article of claim 19, wherein the SES diagnostic page is selected from the group consisting of page 02h and page 0Ah.

* * * * *